United States Patent
Ebner

(10) Patent No.: US 10,372,842 B2
(45) Date of Patent: Aug. 6, 2019

(54) METHOD AND DEVICE FOR CALIBRATING AND UPDATING A POWER MODEL

(71) Applicant: Xerox Corporation, Norwalk, CT (US)

(72) Inventor: Fritz Francis Ebner, Pittsford, NY (US)

(73) Assignee: Xerox Corporation, Norwalk, CT (US)

( * ) Notice: Subject to any disclaimer, the term of this patent is extended or adjusted under 35 U.S.C. 154(b) by 773 days.

(21) Appl. No.: 13/826,988

(22) Filed: Mar. 14, 2013

(65) Prior Publication Data

US 2014/0268198 A1    Sep. 18, 2014

(51) Int. Cl.
*H04N 1/00* (2006.01)
*G06F 17/50* (2006.01)

(52) U.S. Cl.
CPC ..... *G06F 17/5009* (2013.01); *H04N 1/00885* (2013.01)

(58) Field of Classification Search
CPC  G06F 17/5009; H04N 1/00885; G01R 22/00; G01R 11/64
USPC .................. 702/65, 85, 104, 106, 107, 179; 358/1.13; 700/291
See application file for complete search history.

(56) References Cited

U.S. PATENT DOCUMENTS

| | | | | |
|---|---|---|---|---|
| 6,163,775 A * | 12/2000 | Wlaschin | .......... | G06F 17/30315 |
| 6,377,037 B1 * | 4/2002 | Burns | .................. | G01R 21/133 324/107 |
| 6,417,792 B1 * | 7/2002 | King | .................... | G01R 21/133 341/143 |
| 6,493,644 B1 * | 12/2002 | Jonker | ................. | G01R 21/133 702/182 |
| 6,732,129 B1 * | 5/2004 | Ashjaee | ............... | G05B 13/024 708/322 |
| 8,032,317 B2 * | 10/2011 | Houston | ................ | G01R 22/10 702/62 |
| 2004/0032357 A1 * | 2/2004 | White | .................. | G01R 21/133 341/155 |

(Continued)

OTHER PUBLICATIONS

Michael K. NG et al., LMS-Newton Adaptive Filtering Using FFT-based conjugate Gradient Iterations, Mar. 1996, Electronic Transactions on Numerical Analysis, vol. 4, pp. 14-36.*

(Continued)

*Primary Examiner* — Mohammad K Islam
(74) *Attorney, Agent, or Firm* — Fox Rothschild LLP

(57) ABSTRACT

A method and device for calibrating a power model for a multi-state device. The device includes a processor and a computer readable medium containing instructions to instruct the processor to perform the method. The method includes receiving a device state log comprising a time-based representation of multi-state device states for a first period of time and a power trace comprising a time-based representation of power consumed by the multi-state device for the first period of time; eroding the device state log to reduce potential noise present at state transitions within the device state log, thereby producing an eroded device state log; determining energy consumption for each state transition in the eroded power state log; creating an updated power model for the multi-state device based upon the eroded power state log; and storing the updated power model in a non-transitory computer readable medium operably connected to the multi-state device.

22 Claims, 5 Drawing Sheets

(56) References Cited

U.S. PATENT DOCUMENTS

| | | | |
|---|---|---|---|
| 2004/0071244 A1* | 4/2004 | Shaeffer | H03H 15/00 375/350 |
| 2004/0119505 A1* | 6/2004 | Ryan | H03K 3/356173 326/112 |
| 2005/0069065 A1* | 3/2005 | Oh | H04B 17/309 375/350 |
| 2005/0130610 A1* | 6/2005 | Scheck | H03C 3/406 455/126 |
| 2005/0143865 A1* | 6/2005 | Gardner | H02J 3/14 700/291 |
| 2006/0067427 A1* | 3/2006 | Zolfaghari | H03F 1/0211 375/297 |
| 2007/0171111 A1* | 7/2007 | Itahara | H03F 1/3241 341/144 |
| 2011/0144807 A1* | 6/2011 | Buda | F25B 49/005 700/275 |
| 2013/0018620 A1* | 1/2013 | Riendeau | G01M 5/00 702/89 |
| 2013/0238266 A1* | 9/2013 | Savvides | G06Q 50/06 702/61 |
| 2014/0210894 A1* | 7/2014 | Koehler | B41J 11/42 347/16 |

OTHER PUBLICATIONS

US Court of Appeals for Federal circuit; *Enfish* vs *Microsoft*; May 12, 2016, pp. 1-30.*

* cited by examiner

METHOD AND DEVICE FOR CALIBRATING AND UPDATING A POWER MODEL

BACKGROUND

The present disclosure relates to power modeling for a device. More specifically, the present disclosure relates to calibrating and updating a device's power model.

Energy consumption reporting and control for a device, such as an office device, is becoming more interesting to consumers. As electricity becomes more expensive, and consumers strive to become more environmentally conscious, accurate power consumption and modeling is becoming more important.

Many office devices such as printers, copiers and multi-function devices (e.g., a single device capable of scanning, printing, faxing and/or copying) are capable of operating in one or more states. For example, when a device is not used for a given period of time, the device may enter a "sleep" state. During a sleep state, various components in the device go into low power operation or are turned off completely. Once the device receives a request to perform a specific function, the device may exit the sleep state and operate as normal.

Existing techniques for energy modeling use a variety of methods, each having differing accuracy and precision. Many estimate techniques require some form of power model to describe the device's characteristics such as energy used during various states, and the energy used by a device to transition between the states. However, even the most sophisticated and accurate energy consumption techniques rely on power models that ignore many factors that may contribute to energy consumption, including accessories currently being used in combination with the device, potential network traffic coming to and going from the device, and device to device energy consumption deviation between the same models of devices.

Manufacturers may provide a standard power model for a specific device for use in estimating power consumption. However, significant differences between devices, especially in low power state, sleep state, and idle state can exist with different device configurations and associated accessory use, and these differences may not be accurately reflected in a power model for that specific device.

SUMMARY

In one general respect, the embodiments disclose a method of calibrating a power model for a multi-state device. In one embodiment, the method includes receiving a device state log comprising a time-based representation of multi-state device states for a first period of time and a power trace comprising a time-based representation of power consumed by the multi-state device for the first period of time; eroding the device state log to reduce potential noise present at state transitions within the device state log, thereby producing an eroded device state log; determining energy consumption for each state transition in the eroded power state log; creating an updated power model for the multi-state device based upon the eroded power state log; and storing the updated power model in a non-transitory computer readable medium operably connected to the multi-state device.

In another general respect, the embodiments disclose a device for calibrating a power model for a multi-state device. In one embodiment, the device includes a processor and a non-transitory computer readable medium operably connected to the processor. The computer readable medium containing a set of instructions configured to instruct the processor to receive a device state log comprising a time-based representation of multi-state device states for a first period of time and a power trace comprising a time-based representation of power consumed by the multi-state device for the first period of time; erode the device state log to eliminate potential noise present at state transitions within the device state log, thereby producing an eroded device state log; determine energy consumption for each state transition in the eroded power state log; create an updated power model for the multi-state device based upon the eroded power state log; and store the updated power model in at least the non-transitory computer readable medium.

In another general respect, the embodiments disclose a method of calibrating a power model for a multifunction printing device. The method includes receiving a device state log comprising a time-based representation of multi-function print device states for a first period of time and a power trace comprising a time-based representation of power consumed by the multifunction print device for the first period of time, wherein each of the device states represents a specific function the multifunction print device is configured to perform; eroding the device state log to reduce potential noise present at state transitions within the device state log, thereby producing an eroded device state log; determining energy consumption for each state transition in the eroded power state log; creating an updated power model for the multifunction print device based upon the eroded power state log; and storing the updated power model in a non-transitory computer readable medium operably connected to the multifunction print device.

DETAILED DESCRIPTION

Figure 1:
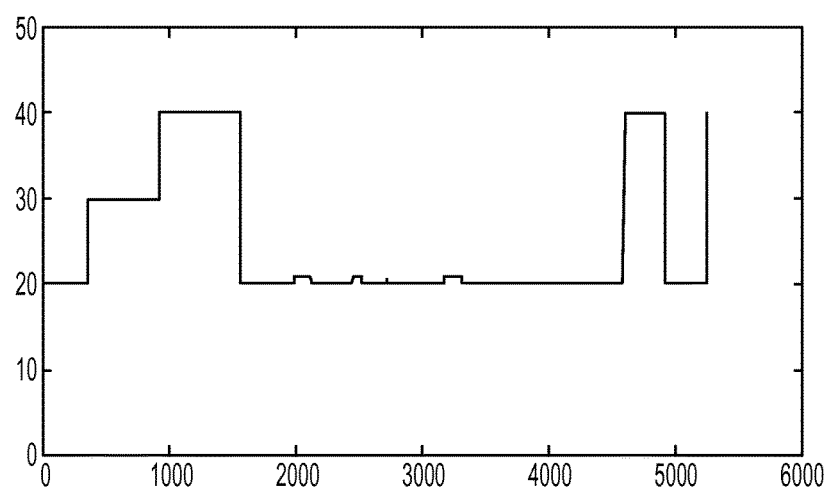
FIG. 1 depicts a device state log for a first period of time according to an embodiment.

This disclosure is not limited to the particular systems, devices and methods described, as these may vary. The terminology used in the description is for the purpose of describing the particular versions or embodiments only, and is not intended to limit the scope.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention. As used in this document, the term "comprising" means "including, but not limited to."

As used herein, a "device" refers to an electronic device configured to perform one or more specific functions. Each device has an associated power model that defines the device's power consumption during certain states as well as the device's power consumption during transitions between certain states.

A "power model" is an estimated representation of power usage for a specific device. If the device is a multifunction device configured to operate in multiple states, the power model includes power consumption levels for each of the multiple states as well as power consumption information for transitioning between from one state to another. A power model may be provided by the manufacturer of a device, or determined by measuring the power consumption of the device as it operates.

A "printing device" is an electronic device that is capable of receiving commands, and/or printing text characters and/or images on a substrate, and/or scanning images. Printing devices may include, but are not limited to, network printers, production printers, copiers and other devices using ink or toner, and scanners. A printing device may also perform a combination of functions such as printing and scanning, in which case such a device may be considered a multifunction device.

A "computing device" refers to a device that processes data in order to perform one or more functions. A computing device may include any processor-based device such as, for example, a server, a personal computer, a personal digital assistant, a web-enabled phone, a smart terminal, a dumb terminal and/or other electronic device capable of communicating in a networked environment. A computing device may interpret and execute instructions.

The present disclosure is directed to a method for calibrating a power model of a device, both at manufacture of the device and in field once the device has been installed and is operational. Additionally, the present disclosure also include a method for updating a device's power model, both resident on the device and published through a standard power management information base (MIB) associated with the device. The calibration method may include the use of a power meter, e.g., a wireless power meter. The calibration method may utilize an MIB power log of a job accounting log to determine device states at specific periods of time, and it correlates the device power state with the true power consumption as measured by the power meter. The calibration method may estimate with high accuracy the device's power used for each state as well as the related state transition costs. A new power model may be created for the device and instated as the device's updated power model.

FIG. 1 illustrates a sample log of a device's states over a period of time. The x-axis represents time, and the y-axis represents the various states for the device. As used herein, a state value refers to a numerical representation of a specific state the device is operating in at a specific time. For example, if the device is a multifunction printing device, the device state values may be 40: sleep, 30: low power, 20: idle, 21: scan, 22: print, and 23: scan and print. For example, as shown in FIG. 1, the device initially may be in the idle state (20 on the y-axis) until about time 400 when it transitions to low power (30 on the y-axis). The device may then transition from low power to sleep (40 on the y-axis) at approximately time 1000. At approximately time 1600, the device may transition from the sleep state to the idle state. Each transition may be caused by the occurrence of any of various events. For example, if the device receives an indication of an incoming job to be processed, it may transition from a sleep state to an idle state. Alternatively, a user may have pushed a button or otherwise interacted with a user interface on the device, causing the device to transition to the idle state.

As shown in FIG. 1, between approximately time 1600 and 4600, the device transitions between various active states (i.e., one of scanning, printing, and both scanning and printing) and idle. The device then transitions back to sleep at approximately time 4600.

The state log as shown in FIG. 1 may be recorded and stored locally at the device in a job accounting database. Additionally, or alternatively, the state log may be stored in a location that is remote from the device such as memory that stores an MIB job log. By using the standard power model provided by the manufacturer of the device, the total power consumption for the device may be estimated. For example, the power model may indicate that the device consumes 20 watts per unit of time (as measured on the x-axis) during the sleep state and 100 watts per unit of time during the low power state. Additionally, the power model may indicate the power consumed by the device during transitions between various states. For example, the power model may indicate the device consumes 1200 watts per unit of time to transition between the sleep state and the idle state. However, as shown in FIG. 1, the transition states may occur in a relatively short period of time. For example, the transition between idle (at time 400) and low power may be nearly instantaneous. However, there is a short period of time where the device is transitioning between the idle state and the low power state.

Variations in individual devices and operating environments may cause an individual device to operate at power consumption levels that are not accurately reflected in the device's manufacturer-provided power model. For example, the speed of the network to which the device is operably attached may cause the device to receive higher amounts of data in a quicker time, causing the device to consume more power during various states than the same model of device connected to a slower network. In order to accurately measure power consumption, a power meter may be used to measure the device's actual power consumption for a period of time.

Figure 2:
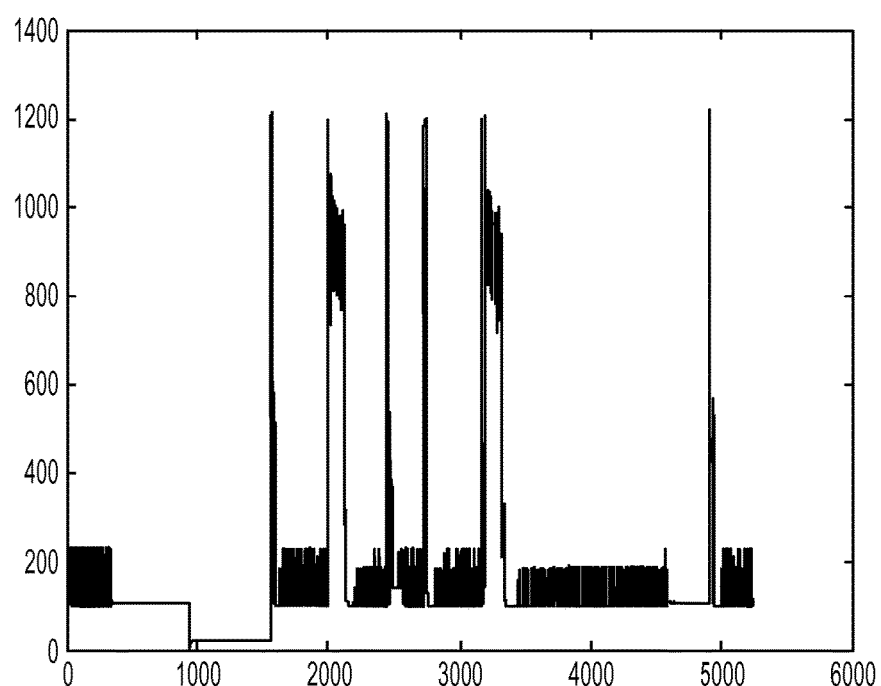
FIG. 2 depicts a power trace for the device state log as shown in FIG. 1 according to an embodiment.

FIG. 2 illustrates a power trace as measured by a power meter for the device discussed above in FIG. 1. The x-axis of FIG. 2 represents time, and the y-axis represents power consumed. Specifically, the power trace as shown in FIG. 2 corresponds in time to the state log shown in FIG. 1. For example, between time 0 and time 400, the device is in an idle state (represented by value 20 on the y-axis of FIG. 1). As shown in FIG. 2, the power consumption when the device is in the idle state fluctuates between about 90 watts and 205 watts. Once the device transitions to the low power state at approximately time 400, the power consumption levels out at about 100 watts. When the device transitions to the sleep state at approximately time 1000, the power consumption levels out at about 20 watts.

As shown in FIG. 2 at approximately time 1600, a transition from the sleep state to the idle state requires a brief period of high power consumption. As before, during the idle state (between time 1600 and time 4600), the device is mainly in the idle state, and the power consumption fluctuates between about 205 watts and 95 watts. However, during the periods of activity, the power consumption may spike to higher levels. For example, at about time 200, the power may initially spike to about 1200 watts during the transition period, and remain at about 800-1000 watts during the activity.

As outlined above, each device may be provided with a manufacturer power model. However, these power models are merely the average values for all similar devices, and are not calibrated for an individual device. In some instances, the manufacturer-provided model may greatly deviate from the actual power model from a device, and a device that was thought to be operating efficiently may be consuming a much higher level of power than indicated by the manufacturer provided power model.

Figure 3:
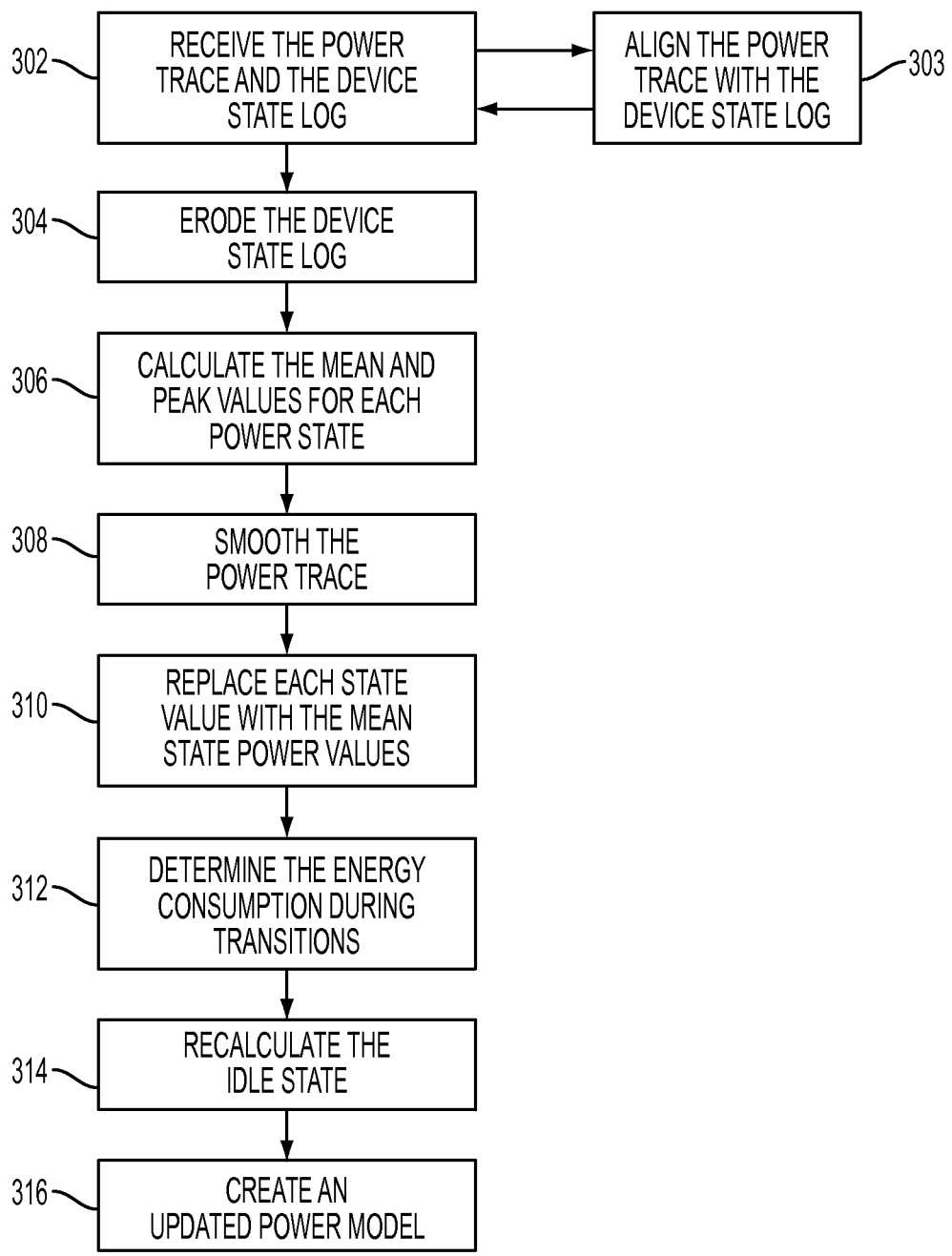
FIG. 3 depicts a sample flow diagram of a method for calibrating and updating a device's power model according to an embodiment.

FIG. 3 illustrates a sample flow diagram of a method for calibrating and updating a device's power model based upon a correlation of a device's state log (e.g., as shown in FIG. 1) with an accurate power trace (e.g., as shown in FIG. 2) to create a highly accurate and precise power model based upon operational parameters of the actual device.

A processing device may receive 302 a digital representation of a device's power trace (e.g., the power trace as shown in FIG. 2) and a digital representation of the device's state log (e.g., the device state log as shown in FIG. 1). Optionally, the processing device may align 303 the power trace and the device state log. Alignment of the logs 303 may be performed if the time base on the device being measured is different from the time base of the power meter. For example, time zero may represent a different real-world time on the device's timer when compared to the power meter's timer. In this instance, the logs may be aligned 303. It should be noted, though, that alignment 303 may be optional or avoided entirely. For example, the device's timer and power meter's timer may be synchronized prior to device measurement so as to avoid alignment 303.

However, if the time bases are off, the power trace and the device state log may be aligned 303 using a correction technique such as cross correlation. Using cross correlation provides multiple vectors of correlation at different vector offsets. The maximum correlation vector may indicate the amount of shift to be included in order to align one vector to another. By determining the amount of shift to be included, the power trace and/or device state log may be shifted accordingly.

Figure 4A:
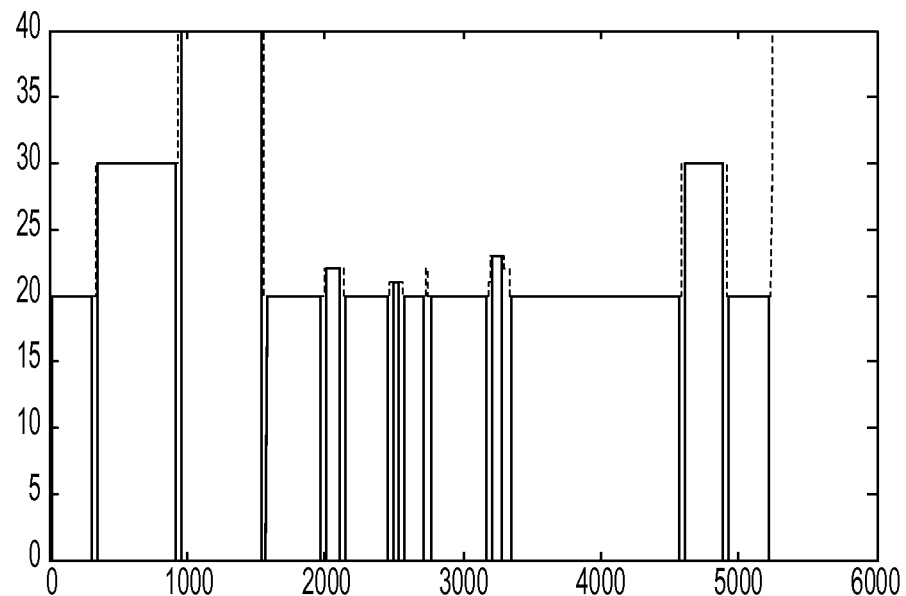
FIG. 4a depicts an eroded device state log according to an embodiment.

In order to reduce any noise present at the edges of power state transitions in the device state log, the processing device may erode 304 the device state log. To erode the power state transitions, the values for the transitions are reduced or eliminated in order to reduce the overall impact of the transitions in the log. For example, to erode 304 the device state log, each transition may be set to zero for the duration of time it takes to complete that transition, thus eliminating the power contribution of the transition state. FIG. 4a illustrates an example of an eroded device state log based upon the device state log originally shown in FIG. 1. By eliminating noise associated with the transition edges, more precise mean calculations may be acquired regarding the actual power consumption of the device during the individual states, as opposed to having the overall power consumption values altered by the noise associated with the transitions.

Based upon the eroded device state log, the processing device may calculate 306 mean and peak power consumption values for each power state. For example, for each non-zero state in the eroded device state log (i.e., for each unit of time that the device is not in a transition state), the mean and peak power consumption values may be calculated 306 based upon the values measured in the power trace.

Figure 4B:
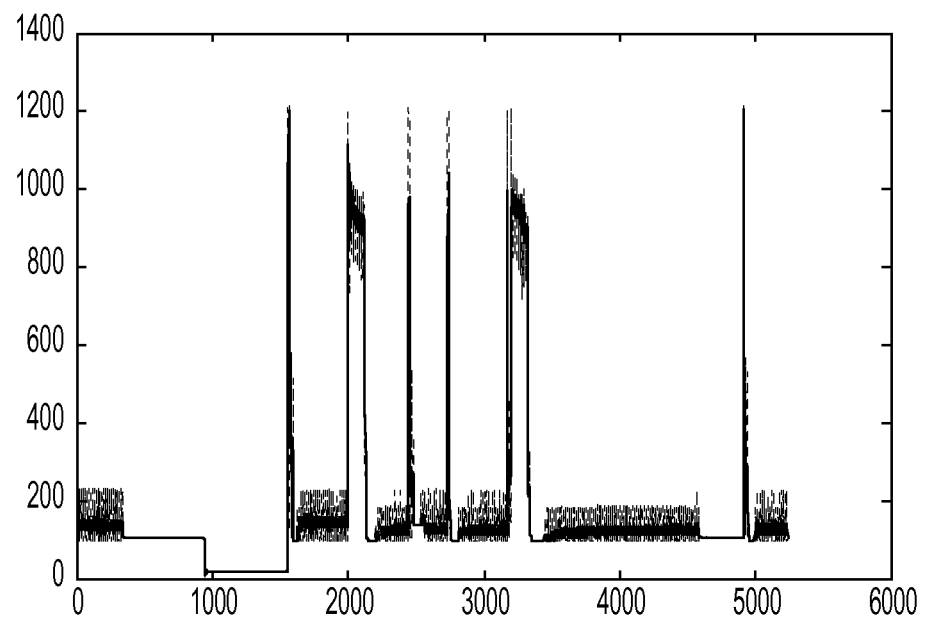
FIG. 4b depicts a smoothed power trace according to an embodiment.

To identify exact locations of transitions in the power trace, the processing device may smooth 308 the power trace to reduce noise. For example, the processing device may smooth 308 the power trace by applying a filter based upon a moving average for the power trace, using a sample rate of, for example, 1/sec. A moving average is a type of finite impulse response filter used to analyze a set of data points by creating a series of averages of different subsets of the full data set. These averages may then be used to smooth out short-term fluctuations in the data set, and to highlight longer-term trends or cycles. FIG. 4b illustrates an example of a smoothed power trace based upon the power trace originally shown in FIG. 2.

The processing device may create an initial estimate of the device's power state trace (i.e., a combined representation of the device's state log and power trace) by replacing 310 each state value in the eroded device state log with the calculated 306 mean state values.

Additionally, in order to accurately reflect power consumption associated with the transitions, the processing device may determine 312 the energy consumption during the transitions. The power consumption may be determine 312 by determining an area under the power trace curve of the smoothed 308 power trace. The area determined 312 under the power trace curve between the start of the transition and the return of the power trace to the calculated 306 mean for the next state (i.e., the state being transitioned to) may represent the power consumption from transition start to end.

The processing device may further recalculate 314 the idle state power consumption for the device. For convenience, a similar erosion technique as used above may be used (i.e., set all transitions to zero) and recalculating the mean power values when the device state is idle. It should be noted that recalculating 314 the idle power as described herein may be an optional step that may result in a more accurate estimate. Similarly, the recalculation 314 may be applied to any power state. However, as a typical device spends a large amount of time in the idle state (e.g., approximately 90%), to improve efficiency and accuracy the recalculation 314 may be limited to the idle state as is shown in FIG. 3.

Based upon the determined 312 energy consumption during the transition periods, and the calculated 306 mean power values for each state, the processing device may create 316 and store an updated power model for the device based upon the actual, measured power trace and device state log. Once updated, the power model may be added to the MIB such that anyone accessing the device remotely may access the power model and perform associated energy consumption estimations based upon the updated and calibrated power model.

Depending on changes to the operation of the device, or relocation of the device to a new network, the calibration process may be repeated to ensure that the power model associated with the device is updated and accurate. Alternatively, the power model may be updated on a regular schedule to ensure that the device is operating appropriately, and no undiscovered errors or other problems are interfering with the operation of the device.

Figure 5:
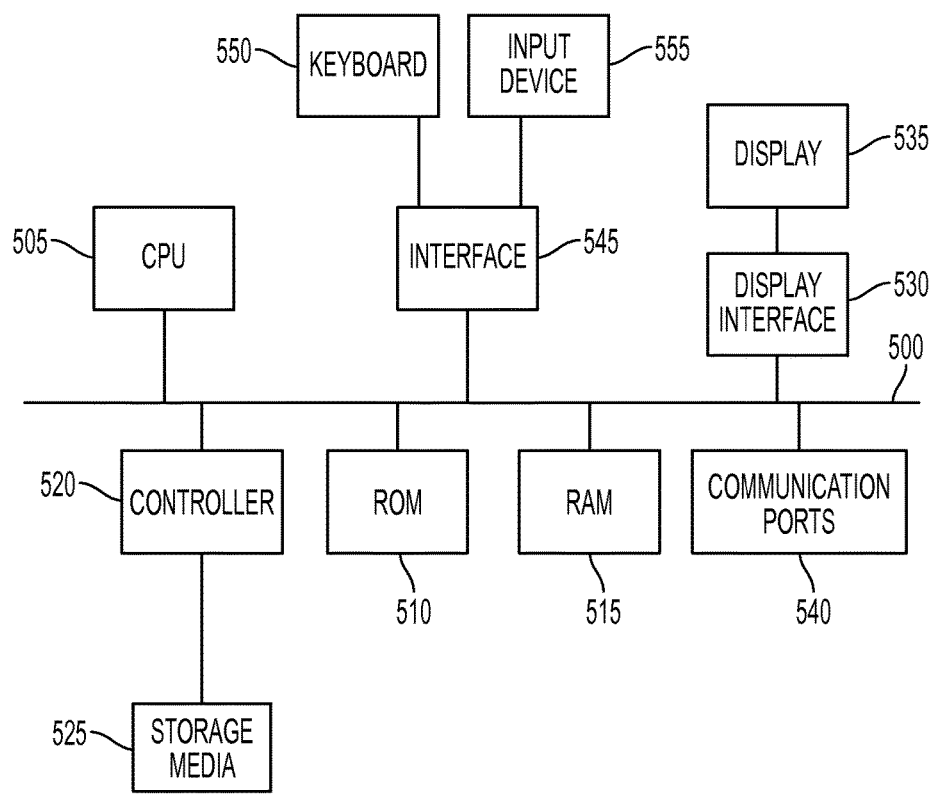
FIG. 5 depicts various embodiments of a computing device for implementing the various methods and processes described herein.

FIG. 5 depicts a block diagram of internal hardware that may be used to contain or implement the various processes and systems as discussed above. An electrical bus 500 serves as the main information highway interconnecting the other illustrated components of the hardware. CPU 505 is the central processing unit of the system, performing calculations and logic operations required to execute a program. For example, CPU 505 may perform the functions performed by the processing device in the above discussion of FIG. 3. CPU 505, alone or in conjunction with one or more of the other elements disclosed in FIG. 5, is a processing device, computing device or processor as such terms are used within this disclosure. Read only memory (ROM) 510 and random access memory (RAM) 515 constitute examples of memory devices.

A controller 520 interfaces with one or more optional memory devices 525 to the system bus 500. These memory devices 525 may include, for example, an external or internal DVD drive, a CD ROM drive, a hard drive, flash memory, a USB drive or the like. As indicated previously, these various drives and controllers are optional devices. Additionally, the memory devices 525 may be configured to include individual files for storing any software modules or instructions, auxiliary data, incident data, common files for storing groups of contingency tables and/or regression models, or one or more databases for storing the information as discussed above.

Program instructions, software or interactive modules for performing any of the functional steps associated with the processes as described above may be stored in the ROM 510 and/or the RAM 515. Optionally, the program instructions may be stored on a tangible computer readable medium such as a compact disk, a digital disk, flash memory, a memory card, a USB drive, an optical disc storage medium, such as a Blu-Ray™ disc, and/or other recording medium.

An optional display interface 530 may permit information from the bus 500 to be displayed on the display 535 in audio, visual, graphic or alphanumeric format. Communication with external devices may occur using various communication ports 540. A communication port 540 may be attached to a communications network, such as the Internet or a local area network.

The hardware may also include an interface 545 which allows for receipt of data from input devices such as a keyboard 550 or other input device 555 such as a mouse, a joystick, a touch screen, a remote control, a pointing device, a video input device and/or an audio input device.

It should be noted that multifunction office device as described above is provided by way of example only. The techniques and processes as taught herein may be applied to additional devices that have varying levels of power consumption based upon their state of operation.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

What is claimed is:

1. A method of updating a power model for a multi-state device, the method comprising:
    receiving, at a processing device, a device state log comprising a time-based representation of states of the multi-state device for a first period of time;
    measuring, by a power meter, power consumed by the multi-state device for the first period of time and generating a digital representation of a power trace based on the measured power consumption;
    receiving by the processing device, the digital representation of the power trace;
    eroding, by the processing device, the device state log wherein the eroding comprises setting to zero a value of the representation for a duration of time of state transition at each state transition within the device state log, thereby producing an eroded device state log;
    smoothing, by the processing device, the power trace by applying a finite impulse response filter to the power trace;
    determining, by the processing device, energy consumption based on an area under the smoothed power trace for the first period of time in the eroded device state log;
    creating, by the processing device, an updated power model for the multi-state device based upon the energy consumption for the first period of time in the eroded device state log;
    storing, by the processing device, the updated power model in a non-transitory computer readable medium operably connected to the multi-state device; and
    using the updated power model to estimate energy consumption of the multi-state device.

2. The method of claim 1, further comprising replacing the power model of the device with the updated power model.

3. The method of claim 1, further comprising:
    prior to eroding the device state log:
    determining whether a time base of the multi-state device is different from a time base of the power meter; and
    upon determining that the time base of the multi-state device is different from the time base of the power meter, aligning the device state log and the power trace to compensate for any time deviations.

4. The method of claim 1, wherein using the updated power model to estimate the energy consumption of the multi-state device comprises:
    determining, by the processing device, mean and peak values for each power state in the eroded device state log; and
    creating, by the processing device, an initial estimate of a state power trace based upon the mean and peak values and the eroded device state log.

5. The method of claim 4, wherein determining the mean and peak values for each state in the eroded device state log comprises calculating a mean and peak value for the duration of time for each state transition in the eroded device state log based on the smoothed power trace.

6. The method of claim 4, wherein calculating the mean and peak values for each state in the eroded device state log comprises calculating a mean and peak value for each non-zero state in the eroded device state log based on the smoothed power trace.

7. The method of claim 4, wherein creating the initial estimate of the state power trace comprises replacing each state value in the eroded power state log with a corresponding mean state power value.

8. The method of claim 1, wherein smoothing the power trace comprises applying a moving average to filter the power trace.

9. A device for updating a power model for a multi-state device, the device comprising:
    a power meter configured to measure power consumed by the multi-state device for a first period of time and generate a digital representation of a power trace based on the measured power consumption;
    a processor; and
    a non-transitory computer readable medium operably connected to the processor, the computer readable medium containing a set of instructions configured to instruct the processor to:
    receive a device state log comprising a time-based representation of states of the multi-state device for the first period of time and the digital representation of the power trace generated by the power meter, erode the device state log by setting to zero a value of the representation for a duration of time of state transition at each state transition within the device state log, thereby producing an eroded device state log, smooth the power trace by applying a finite impulse response filter to the power trace, determine energy consumption based on an area under the smoothed power trace for the first period of time in the eroded device state log, create an updated power model for the multi-state device based upon the energy consumption for the first period of time in the eroded device state log, store the updated power model in a non-transitory computer readable medium operably connected to the multi-state device, and use the updated power model to estimate energy consumption of the multi-state device.

10. The device of claim 9, wherein the set of instructions further comprises instructions configured to instruct the processor to replace the power model of the device with the updated power model.

11. The device of claim 9, wherein the set of instructions further comprises instructions configured to instruct the processor to, prior to eroding the device state log:

determine whether a time base of the multi-state device is different from a time base of the power meter; and upon determining that the time base of the multi-state device is different from the time base of the power meter, align the device state log and the power trace to compensate for any time deviations prior to eroding the device state log.

12. The device of claim 9, wherein the set of instructions for using the updated power model to estimate the energy consumption of the multi-state device comprise instructions configured to instruct the processor to:

determine mean and peak values for each power state in the eroded device state log; and create an initial estimate of a state power trace based upon the mean and peak values and the eroded device state log.

13. The device of claim 12, wherein the set of instructions for determining the mean and peak values for each state in the eroded device state log further comprise instructions configured to instruct the processor to calculate a mean and peak value for the duration of time for each state transition in the eroded device state log based on the smoothed power trace.

14. The device of claim 12, wherein the set of instructions for calculating the mean and peak values for each state in the eroded device state log further comprise instructions configured to instruct the processor to calculate a mean and peak value for each non-zero state in the eroded device state log based on the smoothed power trace.

15. The device of claim 12, wherein the set of instructions for creating the initial estimate of the state power trace further comprise instructions configured to instruct the processor to replace each state value in the eroded power state log with a corresponding mean state power value.

16. The device of claim 9, wherein the set of instructions for smoothing the power trace further comprise instructions configured to instruct the processor to apply a moving average to filter the power trace.

17. A method of updating a power model for a multifunction printing device, the method comprising:

receiving, at a processing device, a device state log comprising a time-based representation of states of the multifunction printing device for a first period of time, wherein each of the states represents a specific function that the multifunction print device is configured to perform;

measuring, by a power meter, power consumed by the multifunction printing device for the first period of time and generating a digital representation of a power trace based on the measured power consumption;

receiving by the processing device, the digital representation of the power trace;

eroding, by the processing device, the device state log, wherein the eroding comprises setting to zero a value of the representation for a duration of time of state transition at each state transition within the device state log, thereby producing an eroded device state log;

smoothing, by the processing device, the power trace by applying a finite impulse response filter to the power trace;

determining, by the processing device, energy consumption based on an area under the smoothed power trace for the first period of time in the eroded device state log;

creating, by the processing device, an updated power model for the multifunction print device based upon the energy consumption for the first period of time in the eroded device state log;

storing, by the processing device, the updated power model in a non-transitory computer readable medium operably connected to the multifunction printing device; and using the updated power model to estimate energy consumption of the multifunction printing device.

18. The method of claim 17, further comprising replacing the power model of the device with the updated power model.

19. The method of claim 17, wherein using the updated power model to estimate the energy consumption of the multifunction printing device comprises:

determining, by the processing device, mean and peak values for each power state in the eroded device state log; and creating, by the processing device, an initial estimate of a state power trace based upon the mean and peak values and the eroded device state log.

20. The method of claim 19, wherein determining the mean and peak values for each state in the eroded device state log comprises calculating a mean and peak value for the duration of time for each state transition in the eroded device state log based on the smoothed power trace.

21. The method of claim 19, wherein calculating the mean and peak values for each state in the eroded device state log comprises calculating a mean and peak value for each non-zero state in the eroded device state log based on the smoothed power trace.

22. The method of claim 19, wherein creating the initial estimate of the state power trace comprises replacing each state value in the eroded power state log with a corresponding mean state power value.

* * * * *